United States Patent [19]

Baker

[11] 4,045,740
[45] Aug. 30, 1977

[54] METHOD FOR OPTIMIZING THE BANDWIDTH OF A RADIO RECEIVER

[75] Inventor: Kenneth L. Baker, Littleton, Colo.

[73] Assignee: The United States of America as represented by the Secretary of the Army, Washington, D.C.

[21] Appl. No.: 625,807

[22] Filed: Oct. 28, 1975

[51] Int. Cl.² .............................................. H04B 1/16
[52] U.S. Cl. ..................................... 325/427; 325/490
[58] Field of Search ............ 178/DIG. 19; 333/70 R, 333/70 A; 325/477, 427, 489, 490

[56] References Cited

U.S. PATENT DOCUMENTS

| | | | |
|---|---|---|---|
| 2,576,329 | 11/1951 | Bell | 178/DIG. 19 |
| 3,541,451 | 11/1970 | Lind | 325/477 |
| 3,783,412 | 1/1974 | Libby | 333/70 A |
| 3,872,387 | 3/1975 | Banach | 178/DIG. 19 |

Primary Examiner—Benedict V. Safourek
Assistant Examiner—Michael A. Masinick
Attorney, Agent, or Firm—John R. Utermohle; Thomas O. Maser; Barry N. Young

[57] ABSTRACT

A method is disclosed for optimizing the bandwidth of a radio receiver capable of receiving widely varying input data rates. The method may be utilized with known superheterodyne receivers having certain modifications to allow for the ability to vary the intermediate frequency and the center frequency of the associated bandpass filters over a continuous range of values. The method includes the steps of determining the optimum intermediate frequency bandwidth for a given input data rate, adjusting a tunable bandwidth filter to a center frequency which is a predetermined multiple of the desired intermediate frequency bandwidth, and producing an intermediate frequency equal to the tuned frequency of the filter.

3 Claims, 2 Drawing Figures

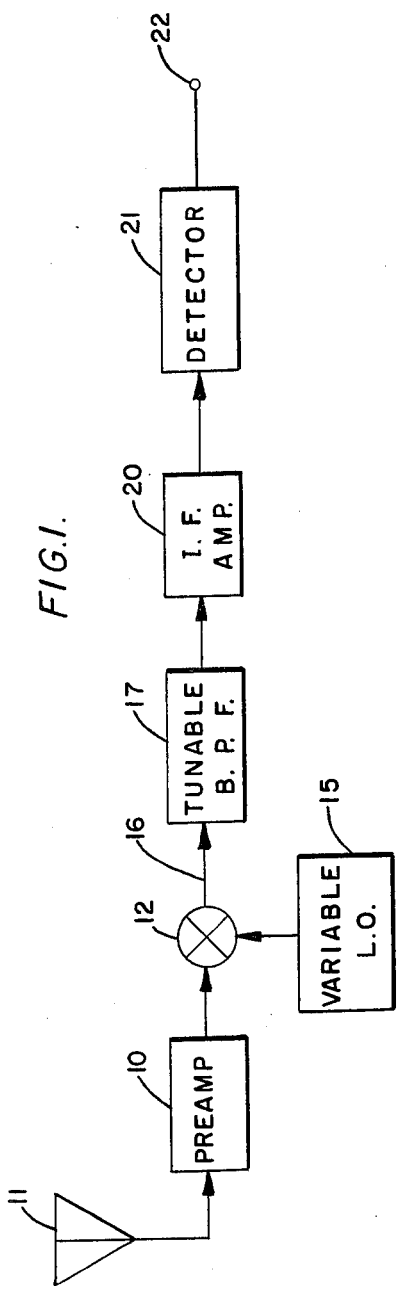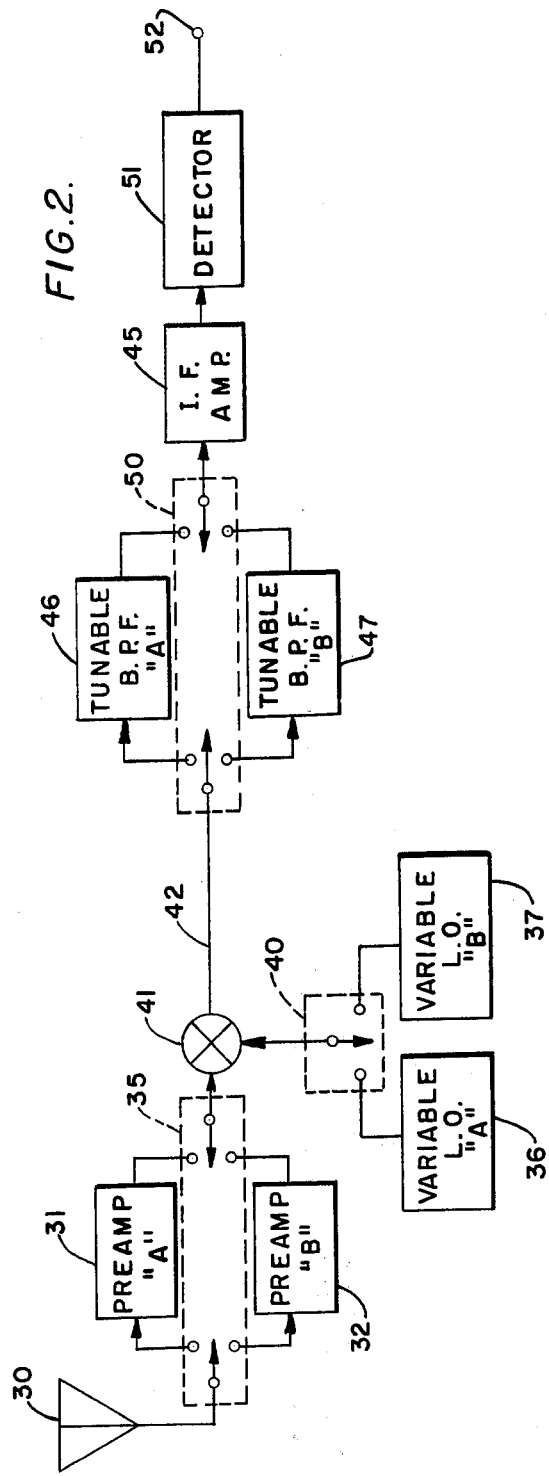

METHOD FOR OPTIMIZING THE BANDWIDTH OF A RADIO RECEIVER

BACKGROUND OF THE INVENTION a. Field of the Invention.

This invention relates generally to the field of radio communications, and more specifically to radio receivers having a variable bandwidth to optimize reception of input signals having widely varying data rates.

b. Description of the Prior Art.

Radio receivers of the heterodyne and superheterodyne type have been a standard of the radio receiver industry for many years. In general, such receivers are designed by determining the maximum bandwidth which will be required for the anticipated input signals, building a bandpass filter capable of passing that bandwidth, and adjusting the intermediate frequency to the center frequency of the filter. Once the receiver is designed and constructed, the intermediate frequency must be held constant as must the width of the passband of the filters. Obviously, the receiver so designed is optimized only for a single, specific input data rate, that rate being the highest rate which the receiver is designed to receive. For any lower input data rate, the bandwidth will be greater than the optimum, with a resulting decrease in reception quality, or a decreased signal-to-noise ratio. Efforts at solving the problem of maintaining optimum quality reception as the input data rate varies are typified by U.S. Pat. No. 3,551,857 to Langer, in which is disclosed a frequency selective system capable of passing signals in more than one frequency range. The solution utilized therein includes a plurality of discrete filters capable of being switched in and out by an operator, whereby it is possible to select that filter which is most near the optimum filter for a given input signal.

For many applications, it is desirable to be able to select, on a continuous rather than a discrete basis, a filter whose bandwidth is the optimum for a given input signal data rate. It is to this end that the present invention is directed.

SUMMARY OF THE INVENTION

It is an object of this invention to provide a method of optimizing the bandwidth of a receiver suitable for receiving widely varying input frequencies.

It is a further object to provide such a method of optimization on a continuously, rather than a discretely, variable basis.

A method having these and other desirable objects may include the steps of: determining by any conventional technique the optimum intermediate frequency bandwidth for a given input data rate, adjusting a tunable N% bandwidth filter to a center frequency which is 100/N times the intermediate frequency bandwidth, and producing an intermediate frequency equal to the tuned frequency of the filter. The method may be better understood, and its attendent objects and advantages more fully appreciated, when considered in conjunction with the following specification and drawings.

BRIEF DESCRIPTION OF THE DRAWINGS

FIG. 1 is a simplified block diagram of a superheterodyne receiver with modifications making it suitable for the practice of the invention; and FIG. 2 is a simplified block diagram of a superheterodyne receiver suitable for the practice of the invention and having a substantially increased usable range over the receiver of FIG. 1.

DESCRIPTION OF THE PREFERRED EMBODIMENT

The method described herein below utilizes the superheterodyne technique and radio receiver components known in the prior art to allow one to operate a radio receiver having the unique property of a continuously variable intermediate frequency bandwidth which may be optimized for any given input signals.

Referring to FIG. 1, a superheterodyne receiver is shown which is suitable for practicing the invention. It includes a preamplifier 10 which receives radio frequency signals from an antenna 11. A mixer 12 combines the signals from the preamplifier 10 and a variable local oscillator 15 to provide an intermediate frequency signal on the line 16. A tunable bandpass filter 17 connects the mixer 12 to an intermediate frequency amplifier 20. A detector 21 is provided between the amplifier 20 and an output terminal 22.

Radio frequency signals received at the antenna 11 are first passed to the preamplifier 10. This preamplifier establishes the overall receiver noise figure and provides gain to overcome the later resulting mixer loss. The frequency range of the receiver must be sufficient to detect the entire range of anticipated input signals, and the preamplifier must have sufficient gain to insure that the preamplifier's noise figure establishes the receiver's overall noise figure. The amplified signal is then converted to an intermediate frequency by the mixer 12, which beats the amplified signal against a signal provided by the variable local oscillator 15.

The output of the mixer 12 is amplified by a high gain amplifier 20 in the manner conventional to a superheterodyne receiver. The tunable bandpass filter 17 center may be a variable center frequency, fixed Q bandpass filter on the input of the amplifier 20. Such a filter has the property defined by the equation:

$$BW/f_c = k$$

where BW is the bandwidth passed by the filter, $f_c$ is the tuned frequency of the filter, and $k$ is some constant, for example 0.05 or 0.10. Such constant Q filters are well-known and are available commercially. Typical of these are the TTA Series and the TTF Series, tunable bandpass filters manufactured by Telonic Industries Inc., Laguna Beach, Calif. These filters are available for various frequency ranges, in various fixed percentage bandwidths between 1%-10% of the tuned center frequency of the filters. Since the bandwidth of the filter, 17 is a fixed percentage of the center frequency, $f_c$, a desired filter bandwidth may be obtained by changing the center frequency of the filter. By adjusting the frequency of the variable local oscillator 15, it is possible to change the intermediate frequency exiting from the mixer 12 to correspond to the center frequency, $f_c$ of the filter 17.

The output of the mixer 12 is amplified by a high gain amplifier 20 before being detected with a diode or similar detector 21. The signal might then be again amplified if necessary before being provided to an output 22 for further processing. The requirements on the local oscillator 15 are that its frequency may be easily varied and have a reasonably flat output spectrum. The local oscillator should preferably be tunable over a large frequency range, determined by the required input frequency range to the receiver and the desired range of bit rates to be received, as will be explained in more detail herein below. As is obvious to those skilled in the art, high gain amplifier 20 must have a frequency response equal to the total frequency range over which the filter 17 tunes.

For purposes of illustration, it may be assumed that a receiver is required which will detect radio frequency signals over a range from 20MHz to 1GHz. The bit rates which may be received may vary from 2 Megabits per second (Mb/s) to 100Mb/s. For any given bit rate, the optimum bandwidth would be numerically equal to twice the bit rate. Accordingly, for a bit rate of 2Mb/s the optimum bandwidth would be 4MHz, and for a bit rate of 100Mb/s, the optimum bandwidth would be 200MHz. Obviously, for bit rates between the two extremes, it would be desirable that the bandwidth be adjusted accordingly to remain at the optimum value.

Given a receiver having the characteristics of that shown in FIG. 1, it is possible to continuously vary the bandwidth over the required range to provide such an optimum receiver. Specifically, with the use of the constant Q filter and a variable local oscillator, it is possible to vary the intermediate frequency leaving the mixer on line 16 to correspond to the center frequency of the bandpass filter 17. For example, at a bit rate of 2Mb/s, the optimum bandwidth would be 2 × 2MHz or 4MHz. If a 5% tunable filter is used, the center frequency would be equal to 100/5, or 20, times the bandwidth. Accordingly, for the 4MHz bandwidth the required center frequency would be 20 × 4MHz or 80MHz.

Since in a superheterodyne receiver the center frequency is equal to the frequency of the local oscillator plus or minus the received radio frequency, it is possible to alter the local oscillator with variations in the received radio frequency to maintain the center frequency constant. Accordingly, if the receiver is tuning at 20MHz, the local oscillator frequency must be at either 60MHz, or 100MHz to maintain the center frequency at 80MHz. At a received radio frequency of 1GHz, the local oscillator must be tuned to 920MHz or 1.08GHz to maintain the center frequency at 80MHz. For any tuned radio frequency between 20MHz and 1GHz, the local oscillator is adjusted accordingly to maintain the center frequency constant at 80MHz.

In the above-described manner, the bandwidth is kept constant throughout the entire radio frequency range. Should the bit rate be increased to, for example, 50Mb/s, the optimum bandwidth would be 2 × 50MHz or 100MHz. The center frequency would become 20 × BW, or 2GHz. For an input radio frequency of 200MHz, the local oscillator thus must be tuned to either 2.2GHz or 1.8GHz. If the radio frequency is increased to 1GHz, the local oscillator must be tuned to either 1GHz or 3GHz in order to maintain the center frequency constant at 2GHz.

It may be seen from the foregoing examples, that for any given bit rate the optimum bandwidth may be determined. From the optimum bandwidth, it is possible to determine the required center frequency for the receiver. Thereafter, by varying the frequency of the local oscillator in accordance with the varying received radio frequency, it is possible to maintain the center frequency constant and thereby maintain constant the optimum bandwidth for that bit rate. As the bit rate changes, it becomes necessary to vary the local oscillator such that the new intermediate frequency is equal to the value of the new center frequency required to maintain the optimum bandwidth for that bit rate.

A procedure, therefore, by which the optimum bandwidth may be obtained for any given bit rate of input information will include the steps of:

1. Determining the optimum intermediate frequency bandwidth based upon the data rate to be received;
2. Adjusting a constant Q continuously a tunable bandwidth filter to a tuned frequency which is a predetermined multiple of the above intermediate frequency bandwidth; and
3. Adjusting the intermediate frequency until it is equal to the tuned frequency of the filter.

FIG. 2 illustrates a further improvement of the receiver of FIG. 1, allowing for even greater ranges of data rates to be received under optimum bandwidth conditions. In FIG. 2, an antenna 30 supplies radio frequency signals to a switch 35, which makes possible the placing of either a pair of preamplifiers 31 or 32 into the receiver circuit. A pair of variable local oscillators 36 and 37 are independently connectable by a switch 40 to a mixer 41, which mixes a local oscillator signal with a preamplifier signal to produce an intermediate frequency signal on line 42. This signal is passed through either of a pair of tunable bandpass filters 46 and 47, the filters being selectable by a switch 50. The filtered signal is then routed through an intermediate frequency amplifier 45 and a detector 51 to an output terminal 52 for further processing.

The method for operating the apparatus of FIG. 2 is identical to that of FIG. 1. However, the useful operating range of the apparatus of FIG. 2 is substantially increased by the added ability to selectively switch into the receiver circuit that component covering the necessary frequency range. If, as in the previous example, it is necessary for the receiver to tune between 20MHz and 1GHz radio frequencies, it is required that the preamplifier 10 of FIG. 1 be capable of amplifying the signal over the entire frequency range with an acceptable noise figure. However, such an amplifier may not be readily available or it may be prohibitively expensive. An alternative is to connect two preamplifiers 31 and 32 as shown in FIG. 2, with one preamplifier covering the lower part of the required frequency scale and the second preamplifier covering the upper part. Obviously, there must be some overlap to insure continuous operation over the complete frequency range.

Similarly, the required ranges of the variable local oscillator may be divided between two units 36 and 37 with the appropriate oscillator being selectable by the switch 40, and the range of the tunable bandpass filter may be divided between two units 46 and 47 with the appropriate filter being selectable by the switch 50. In each case, it may be seen that the range must overlap to insure that the ability to provide continuous operation over the entire frequency range is maintained. It is obvious from the above description that any number of additional necessary units may be added to the circuit with appropriate switching.

The above description is of a preferred method for the carrying out of the invention. It is to be understood that the method is not limited to the use of any specific apparatus, and may be practiced on any receiver of the type wherein the intermediate frequency may be varied at the will of the operator, and where the passband of the intermediate frequency filter is a function of that intermediate frequency.

I claim:

1. A method for optimizing the bandwidth of a radio receiver over a continuous range of input bit rate values, comprising the steps of:
   determining the optimum intermediate frequency bandwidth for a given input data rate,
   adjusting a constant Q continuously tunable bandwidth filter to a tuned frequency which is a predetermined multiple of the desired intermediate frequency bandwidth, and
   adjusting the intermediate frequency until it is equal to the tuned frequency of the filter.

2. The method of claim 1 wherein adjusting the filter includes adjusting a tunable N% bandwidth filter to a tuned frequency which is 100/N times the desired intermediate frequency bandwidth.

3. The method of claim 2 wherein determining the optimum intermediate frequency bandwidth includes determining a bandwidth which is numerically equal to twice the bit rate.

* * * * *